(12) United States Patent
Nakamura

(10) Patent No.: US 6,473,329 B1
(45) Date of Patent: Oct. 29, 2002

(54) SEMICONDUCTOR MEMORY AND METHOD FOR ACCESSING SEMICONDUCTOR MEMORY

(75) Inventor: Takashi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/530,727
(22) PCT Filed: Nov. 12, 1998
(86) PCT No.: PCT/JP98/05084
§ 371 (c)(1),
(2), (4) Date: May 4, 2000
(87) PCT Pub. No.: WO99/26252
PCT Pub. Date: May 27, 1999

(30) Foreign Application Priority Data

Nov. 14, 1997 (JP) ............................................. 9-313359
Nov. 14, 1997 (JP) ............................................. 9-313360

(51) Int. Cl.⁷ .............................................. G11C 11/22
(52) U.S. Cl. ......................... 365/145; 365/149; 365/222
(58) Field of Search ................................. 365/145, 149, 365/222

(56) References Cited

U.S. PATENT DOCUMENTS 5,640,030 A * 6/1997 Kenney ....................... 365/145
6,067,244 A * 5/2000 Ma et al. ..................... 365/149

* cited by examiner

Primary Examiner—Vu A. Le
(74) Attorney, Agent, or Firm—Hogan & Hartson, LLP

(57) ABSTRACT

A semiconductor memory provided with ferroelectric layers, that includes memory cells, buffer cells, and buffer circuits. The memory cells each include a ferroelectric memory FET having a ferroelectric layer between a gate electrode and a semiconductor layer. The buffer cells are capable of storing data from the memory cells to prevent the data from being lost when a disturbing voltage is applied to the memory cells. The buffer circuits are for transferring the data in the memory cells to the buffer cells and for further writing the transferred data again to the memory cells.

20 Claims, 13 Drawing Sheets

|  | WL1 | WL2 | SL1 | SL2 | BL1 | BL2 | DL1 | DL2 |
|---|---|---|---|---|---|---|---|---|
| WRITE "1" | 0 | 2/3Vcc |  |  | Vcc | 1/3Vcc |  |  |
|  | Vcc | 1/3Vcc |  |  | 0 | 2/3Vcc |  |  |
| WRITE "0" | Vcc | 1/3Vcc |  |  | 0 | 2/3Vcc |  |  |
|  | 0 | 2/3Vcc |  |  | Vcc | 1/3Vcc |  |  |
| READ | −V1 | 0 |  |  | 0 |  | −$v_{SA}$ |  |
|  | V1 | 0 |  |  | 0 |  | $v_{SA}$ |  |

WRITING PULSE

DISTURBING PULSE

MEASUREMENT OF SWITCHING CHARGE AMOUNT

DISTURBING PULSE

|     | WL1 | WL2 | SL1 | SL2 | BL1 | BL2 | DL1 | DL2 | RL1 | RL2 | RL3 | RL4 | RL5 |
|-----|-----|-----|-----|-----|-----|-----|-----|-----|-----|-----|-----|-----|-----|
| (1) |     |     |     |     |     |     |     |     |     | Vcc | 0 | Vcc | 0 |
| (2) | V1  |     | Vcc |     | 0   | 0   | OPEN | OPEN |     | 0 |   | 0 | Vcc |
| (3) | Vcc |     |     |     | 0   | 0   |     |     |     |   |   |   |   |
| (4) | 0   | 2/3Vcc |  |   | OPEN | OPEN |   |   | Vrw | 0 | V1 | Vcc | 0 |

(1) INITIALIZE BUFFER CELL
(2) MEMORY CELL TO BUFFER CELL
(3) INITIALIZE MEMORY CELL
(4) BUFFER CELL TO MEMORY CELL

FIG.13(a)
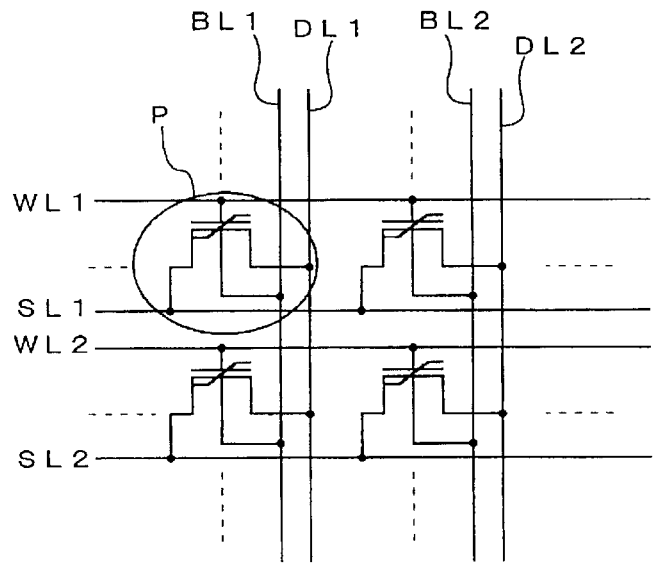
FIG.13(b)
|  | WL1 | WL2 | SL1 | SL2 | BL1 | BL2 | DL1 | DL2 |
|---|---|---|---|---|---|---|---|---|
| WRITE "1" | Vcc | 1/3Vcc |  |  | 0 | 2/3Vcc |  |  |
| WRITE "0" | 0 | 2/3Vcc |  |  | Vcc | 1/3Vcc |  |  |
| READ | V1 | 0 |  |  | 0 |  | $V_{SA}$ |  |
FIG.14
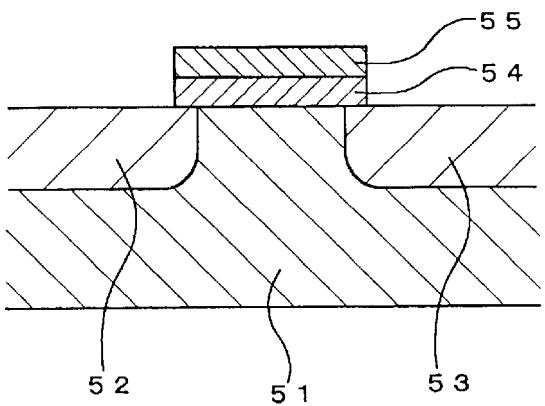

SEMICONDUCTOR MEMORY AND METHOD FOR ACCESSING SEMICONDUCTOR MEMORY

CROSS REFERENCE TO RELATED APPLICATIONS

The entire disclosure including the specifications, claims, drawings, and abstracts of Japanese patent applications Nos. Hei 9-313359, filed on Nov. 14, 1997 and Hei 9-313360, filed on Nov. 14, 1997 is incorporated herein by reference.

TECHNICAL FIELD

This invention relates to non-volatile semiconductor memory using ferroelectric capacitors, and more specifically to a semiconductor memory comprising ferroelectric memory FETs each having at least a ferroelectric layer between a gate electrode and a semiconductor layer, and to a method of gaining access to the semiconductor memory.

BACKGROUND ART

A ferroelectric memory has for example an FET structure as shown in FIG. 14 in which a ferroelectric layer 54 and a gate electrode 55 are provided on part of a semiconductor substrate 51 between a drain region 52 and a source region 53 formed on a semiconductor substrate 51. It is known that; when a high voltage is applied between the gate electrode 55 and the semiconductor substrate 51, polarization charge is produced, and "1" or "0" is written depending on the direction of polarization; the data "1" or "0" can be read by applying a low voltage to the gate electrode; and the data do not disappear even if power is turned off. Therefore it is known that the device can be used as a non-volatile memory of non-destructive reading type. However, practical use of a memory is yet to be realized in which the above-described memory cells are arranged as a matrix circuit. That is, a method is known in which each of cells arranged as a matrix may be accessed through selection elements provided, two for each cell, one for writing and the other for reading. However, when two selection elements are used for each cell respectively, a problem arises that the cell area increases and the degree of integration extremely decreases.

On the other hand, an access method is considered for example for a memory made of matrix-arranged ferroelectric capacitors, in which a power source voltage Vcc is equally divided into three and applied to each line, in order to prevent a voltage from being applied to a cell other than an intended, selected cell at the time of writing for example and prevent the data from being rewritten. To apply the three equally divided voltage application method to a memory in which ferroelectric memory FETs are arranged as a matrix, the following access method may be considered.

That is, as shown in the simplified drawing FIG. 13(*a*), in the case cells comprising a plurality of ferroelectric memory FETs in matrix-pattern are wired and "1" is to be written to a selected cell P, the writing is carried out by applying Vcc to a word line WL1 on which the selected cell P is present, ⅓ of Vcc to a word line WL2 on which the selected cell P is absent, 0 to a bit line BL1 on which the selected cell P is present, and ⅔·Vcc to a bit line BL2 on which the selected cell P is absent. In the case "0" is to be written to the selected cell P, 0 is applied to the word line WL1, ⅔ of Vcc to the word line WL2, Vcc to the bit line BL1, and ⅓ of Vcc to the bit line BL2. When the selected cell P is to be read, V1 (a voltage lower than Vcc at the time of reading) is applied to the word line WL1, 0 to the word line WL2, 0 to the bit line BL1, and $V_{SA}$ (data detecting voltage) to a data line DL1. The sequence in writing and reading "1" and "0" is shown in FIG. 13(*b*). The blank boxes in FIG. 13(*b*) denote that the corresponding lines are open or at 0 V. As a result, when the writing is carried out, a high voltage of Vcc or −Vcc is applied between the gate electrode and the semiconductor substrate to write "1" or "0." At this time, the voltage applied to a cell not selected is ⅓ of Vcc or −⅓ of Vcc and writing is not carried out. At the time of reading, while V1 is applied between the gate electrode and the semiconductor substrate in selected cells, cells not selected are open or at 0 V, almost no voltage is applied, and no reading is carried out.

While writing and reading can be made by selecting only an intended cell as described above, at the time of writing for example, the voltage of ⅓ of Vcc is also applied to cells not selected. When the voltage ⅓ of Vcc is applied, polarization of ferroelectric capacitor (polarization corresponding to the stored data "1" or "0") is disturbed. After repeated applications, there is a concern that the data stored in cells to which no writing is made may change. Under such a circumstance, there are following problems: For the small-sized semiconductor memories using the ferroelectric memory cells, an access method without disturbing the data stored in the memory cells not selected is yet to be established. And as described above, a semiconductor memory has not yet been put to practical use in which the ferroelectric memory FETs are arranged as a matrix of cells.

SUMMARY OF THE INVENTION

According to the invention, a semiconductor memory provided with ferroelectric layers, that includes memory cells, buffer cells, and buffer circuits. The memory cells each include a ferroelectric memory FET having a ferroelectric layer between a gate electrode and a semiconductor layer. The buffer cells are capable of storing data from the memory cells to prevent the data from being lost when a disturbing voltage is applied to the memory cells. The buffer circuits are for transferring the data in the memory cells to the buffer cells and for further writing the transferred data again to the memory cells.

Also according to the invention, a semiconductor memory provided with ferroelectric layers, that includes a plural number of memory cells, buffer cells, and buffer circuits. The plural number of memory cells are arranged in a matrix each memory cell comprising a ferroelectric memory FET having a ferroelectric layer between a gate electrode and a semiconductor layer. The buffer cells are capable of storing data from at least one line of the memory cells to prevent the data from being lost when a disturbing voltage is applied to the memory cells. The buffer cells are ferroelectric memory FETs each having a ferroelectric layer between a gate electrode and a semiconductor layer. The buffer circuits are for transferring the data in at least one line of the memory cells as a whole to the buffer cells and further writing the transferred data again to the memory cells. Each buffer circuit includes a first selection element for making connection between the gate electrode of each buffer cell and a data line of the memory cell to control the transfer of data from the memory cell, a second selection element connected to the gate side of the buffer cell to control the reading of data from the buffer cell, and a transformer connected to a bit line connecting substrates of the memory cells for converting the voltage of the data read from the buffer cell.

Further according to the invention, a semiconductor memory provided with ferroelectric layers, that includes memory cells, buffer cells, and buffer circuits. The memory cells each are a ferroelectric memory FET having a ferroelectric layer between a gate electrode and a semiconductor layer. The buffer cells are capable of storing data from the memory cells to prevent the data from being lost when a disturbing voltage is applied to the memory cells. The buffer cells are ferroelectric memory FETs each having a ferroelectric layer between a gate electrode and a semiconductor layer. The buffer circuits are for transferring the data in the memory cells to the buffer cells and for further writing the transferred data again to the memory cells. Each buffer circuit includes a first selection element for making connection between the gate electrode of each buffer cell and a data line of the memory cell to control the transfer of data from the memory cell, a second selection element connected to the gate side of the buffer cell to control the reading of data from the buffer cell, and a transformer connected to a bit line connecting substrates of the memory cells for converting the voltage of the data read from the buffer cell.

While the features of this invention can be broadly shown as described above, its constitution and contents together with its objects and other features will become further apparent from the following disclosure in reference to the appended drawings.

BRIEF DESCRIPTION OF THE DRAWINGS

FIGS. 13(a) and 13(b) are explanatory drawings of accessing matrix-arranged ferroelectric memory FETs using the three equally divided voltage method.

FIG. 14 is an explanatory drawing of a ferroelectric memory FET as an example.

DETAILED DESCRIPTION OF THE INVENTION

Now the method of writing and reading to and from a semiconductor memory using a ferroelectric layer as an embodiment of this invention will be described in reference to the appended drawings.

Figures 1A, 1B:
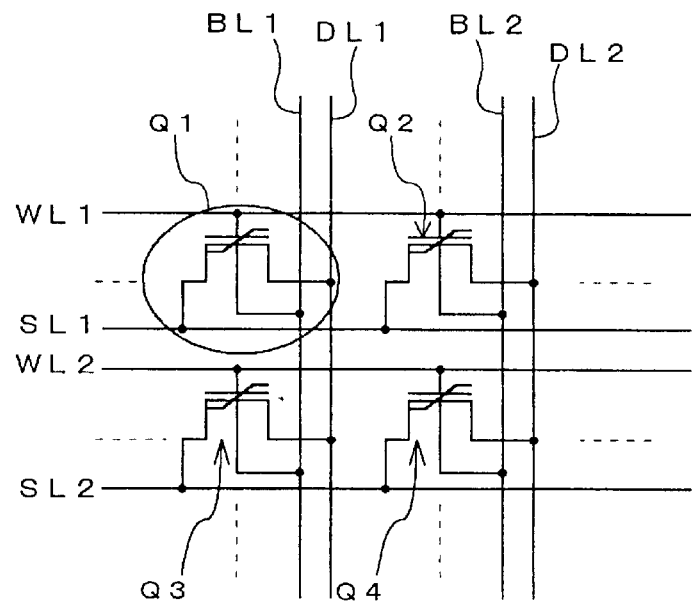
FIG. 1(a) is a wire connection diagram of a semiconductor memory as an embodiment of the invention.
FIG. 1(b) is a table, showing an operation sequence of the semiconductor memory shown in FIG. 1(a).

The method of writing and reading to and from a semiconductor memory using a ferroelectric layer as an embodiment of this invention uses the semiconductor memory shown in FIG. 1(a) according to the sequence shown in FIG. 1(b). FIG. 1(a) shows part of the semiconductor memory including four memory cells Q1 to Q4 arranged as a matrix and made of ferroelectric memory FETs each having a ferroelectric layer between a gate electrode and a semiconductor layer. When selecting a memory cell and writing or reading data to or from the selected memory cell, the method as an embodiment of this invention is characterized in that a voltage of opposite direction to that of a voltage for writing or reading is applied before applying the voltage for writing or reading. That is, the applicant has found the following facts after repeating diligent studies and examinations: The influence of the disturbing voltage of $\frac{1}{3}$·Vcc applied to cells not selected on the data in the cell not selected was examined, for example when data are written by the method of equally dividing the power source voltage into three, through changes in the amount of charge in the ferroelectric capacitor. As a result, it has proved that, as will be described later, although the amount of charge in the ferroelectric capacitor is disturbed even when a low voltage is applied, the disturbing phenomenon is offset and the charge is restored by the application of an opposite directional disturbing pulse. Based on such findings, the characteristic of this invention lies in preventing the data from being deteriorated by the disturbing voltage when the data are written or read; the prevention is effected by applying an opposite directional voltage before applying the voltage for writing or reading.

Next, concrete examples will be described further in detail in reference to FIG. 1. FIG. 1(a) shows part of a matrix structure comprising four memory cells Q1 to Q4 made of ferroelectric memory FETs. Gate electrodes of cells arranged side by side in the lateral direction are connected and respectively provided with word lines WL1 and WL2. Sources of cells arranged side by side in the lateral direction are connected and respectively provided with source lines SL1 and SL2. Drains of cells arranged one over another in the vertical direction are connected and respectively provided with data lines DL1 and DL2. Substrates (semiconductor layers) of cells arranged one over another in the vertical direction are connected and respectively provided with bit lines BL1 and BL2. Thus, part of the matrix is formed.

To write "1" to a selected cell Q1, first, 0 is applied to the word line WL1 of the selected cell Q1, Vcc is applied to the bit line BL1 of the selected cell Q1, $\frac{2}{3}$ of Vcc to the word line WL2 of a not-selected cell, and $\frac{1}{3}$ of Vcc to the bit line BL2 (an opposite voltage to that for writing "1" is applied). Next, Vcc is applied to the word line WL1, 0 is applied to the bit line BL1, $\frac{1}{3}$·Vcc to the word line WL2 of the not-selected cell, and $\frac{2}{3}$ of Vcc to the bit line BL2. Thus, "1" is written to the memory cell Q1. In turn, to write "0" to the memory cell Q1, first, like the case of writing "1," Vcc is applied to the word line WL1 of the selected cell Q1, 0 to the bit line BL1, $\frac{1}{3}$ of Vcc to the word line WL2 of the not-selected cell, and $\frac{2}{3}$ of Vcc to the bit line BL2. Next, 0 is applied to the word line WL1, and Vcc to the bit line BL1 to write "1," and $\frac{2}{3}$ of Vcc to the word line WL2 of the not-selected cell, and $\frac{1}{3}$ of Vcc to the bit line BL2, respectively.

To read data from the selected cell Q1, first, −V1 is applied to the word line WL1 (V1 is the voltage required to turn on the FET of the cell to which "1" or "0" is written, and depends on the difference in threshold voltages of FETs and the impurity concentration in the Si substrate, and the voltage can be adjusted by adjusting the amount of impurities mixed), the bit line BL1 and the word line WL2 are set to zero (0 V), $-V_{SA}$ (data detection voltage) is applied to the data line DL1, and then V1 is applied to the word line WL1, 0 to both of the bit line BL1 and the word line WL2, and $V_{SA}$ to the data line DL1. Thus, the data is read from the selected cell Q1. A sequence of steps of the writing and reading is shown in FIG. 1(b) where the blank boxes correspond to the state of open or at 0 V.

Figure 2:
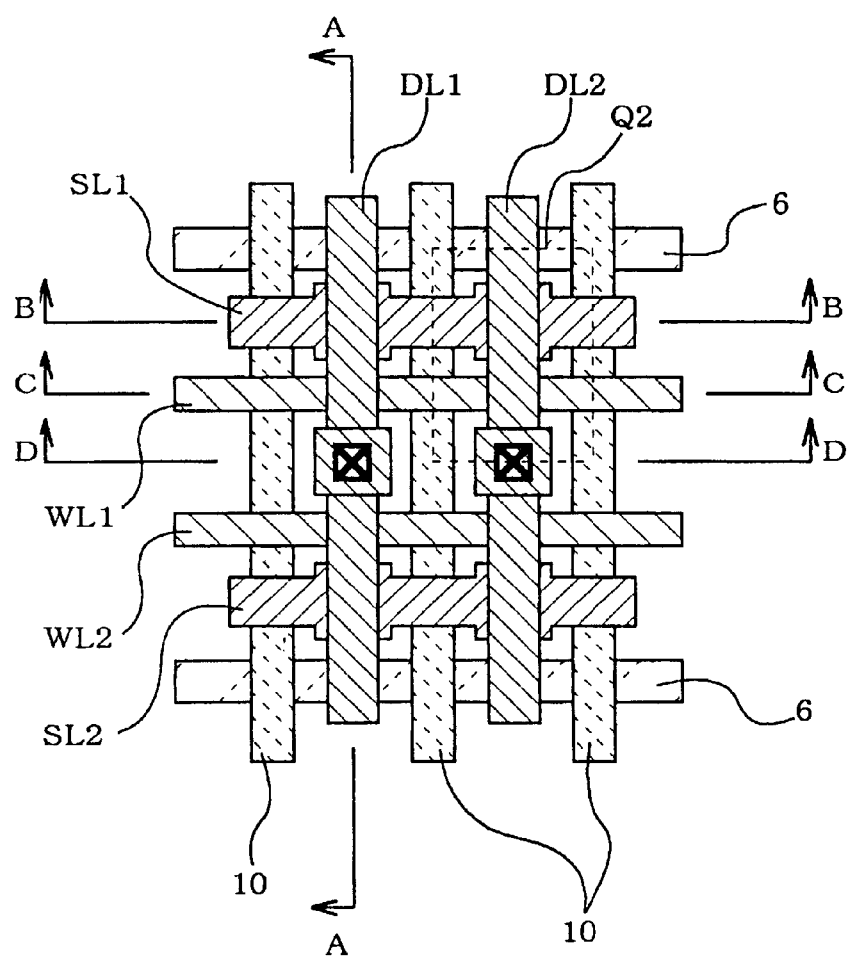
FIG. 2 is an explanatory plan view, showing an example of a structure of a memory cell portion in FIG. 1.
Figure 3A:
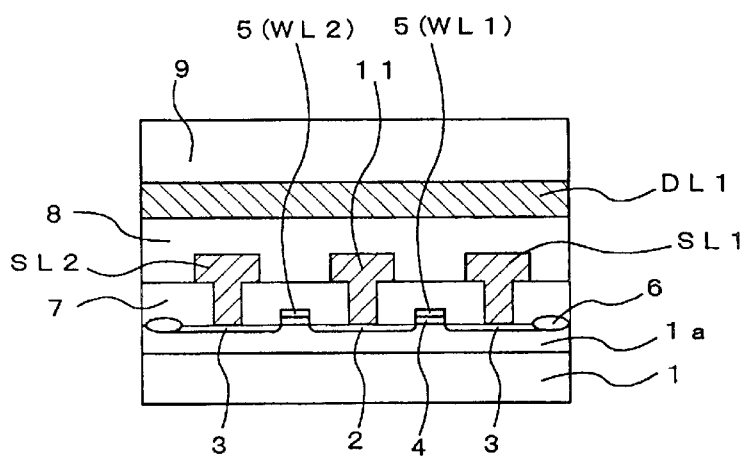
FIGS. 3(a) to 3(d) are explanatory drawings of cross sections in FIG. 2.
Figure 3B:
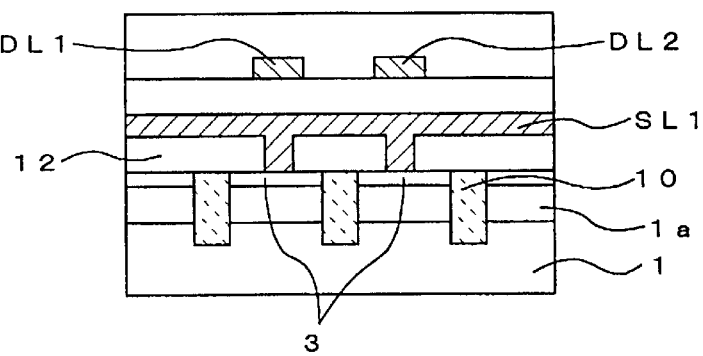
Figure 3C:
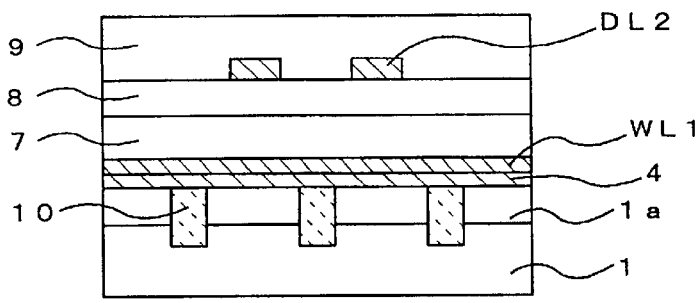
Figure 3D:
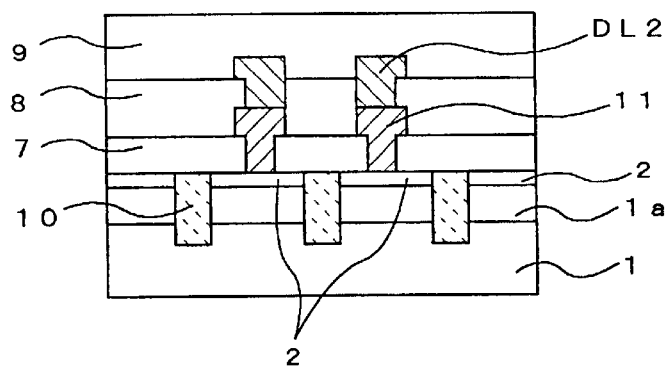

The structure of the memory cell described above may be made as shown in FIGS. 2 and 3: FIG. 2 is a plan view of an example structure, FIGS. 3(a) to 3(d) are explanatory drawings showing its sections A—A, B—B, C—C, and D—D, respectively. The figures show part of the structure comprising ferroelectric memory FETs (memory cells Q1 to Q4). In this example, the cells are separated from each other with deep trench isolations 10 embedded in deep trenches formed into the semiconductor substrate.

This structure is made for example as follows: A p-type of well 1a is provided on a p- or n-type of semiconductor substrate 1, n-type of drain region 2 and a source region 3 are respectively formed on the well 1a, and gate electrodes 5 (WL1, WL2) made of polysilicon or the like are disposed between both of the regions through a ferroelectric layer 4 made of PZT or the like. The reference numeral 6 denotes a LOCOS oxidation film; 7, 8 and 9 respectively denote interlayer insulation films, and 10 denotes deep isolations dividing the well 1a into respective columns. The part shown as Q2 in FIG. 2 is a memory cell. Gate electrodes of the respective cells arranged side by side in lateral rows are connected through word lines WL1 and WL2. Likewise, the source regions 3 of the cells arranged side by side in lateral rows are connected through source lines SL1 and SL2, and first metallic layers 11 connected electrically to the drain regions 2 of the respective cells arranged one over another in the vertical columns are connected through data lines DL1 and DL2. In this way, the memory cells are arranged as a matrix as shown in FIG. 1 by way of an equivalent circuit diagram. Incidentally, the bit lines BL1 and BL2 are connected to the well 1a.

Figure 4:
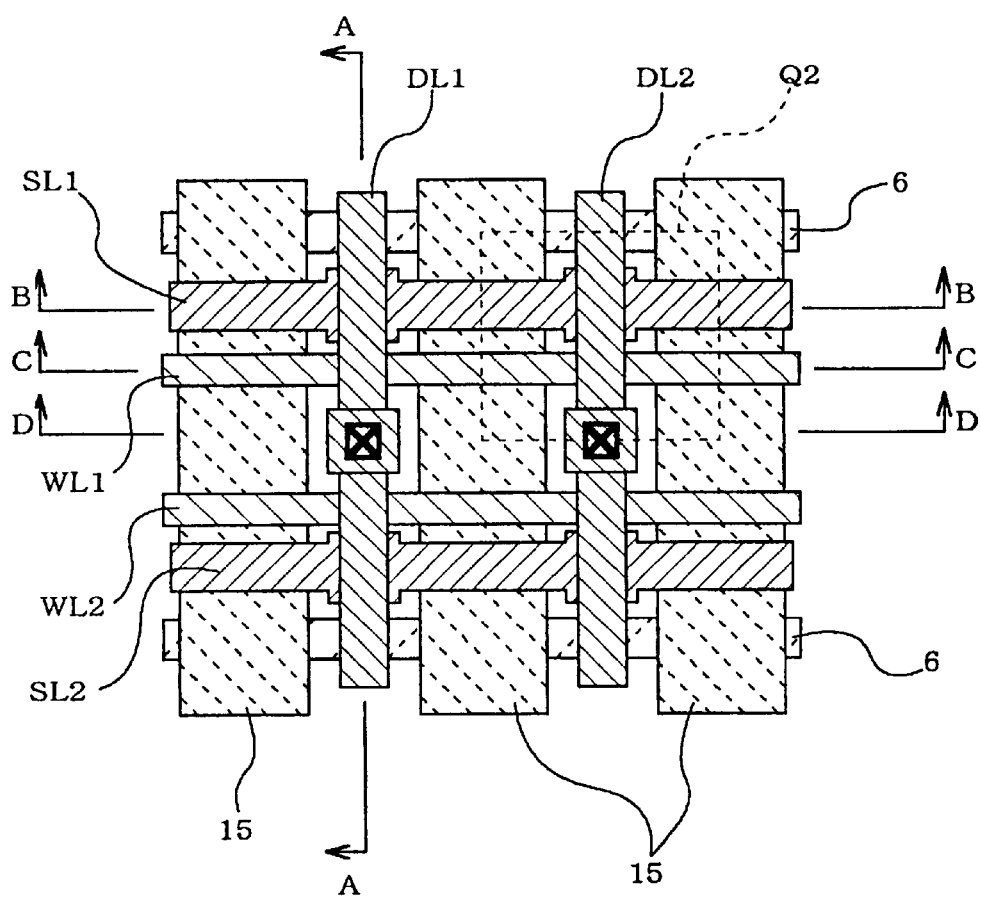
FIG. 4 is an explanatory plan view, showing another example of a structure of the memory cell portion of FIG. 1.
Figure 5A:
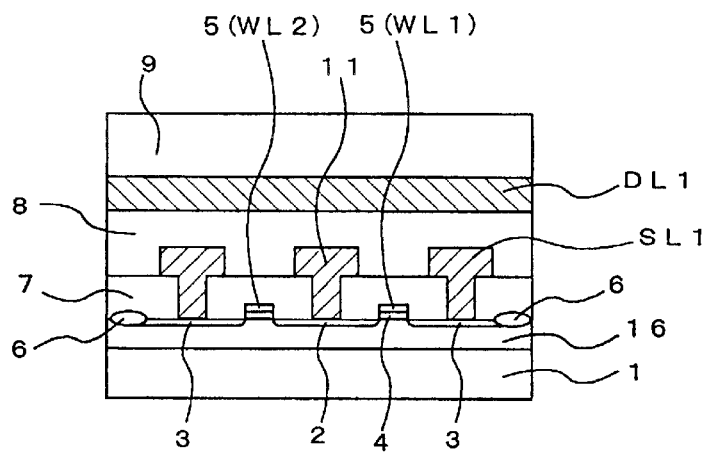
FIGS. 5(a) to 5(d) are explanatory drawings of cross sections in FIG. 4.
Figure 5B:
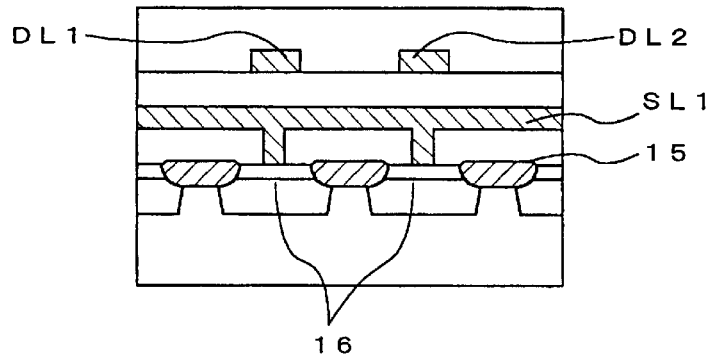
Figure 5C:
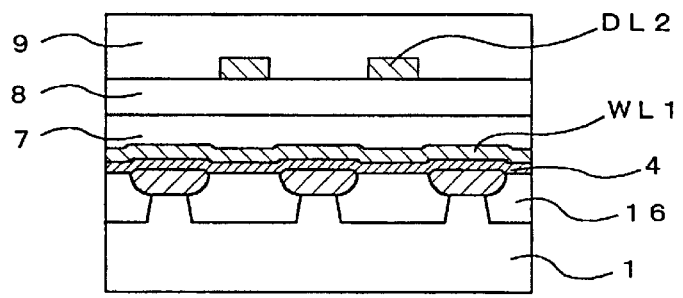
Figure 5D:
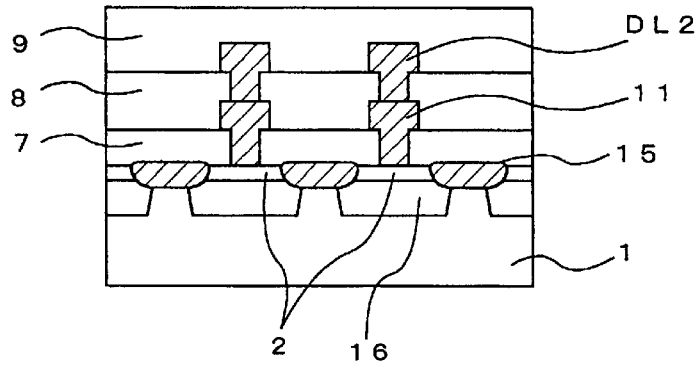

FIGS. 4 and 5, similar to FIGS. 2 and 3, show another example structure of semiconductor memory of the invention. In this example, p-type of wells 16 are formed on the semiconductor substrate 1, in the wells 16 are formed n-type of drain region 2 and source regions 3. The wells 16 are separated with separation films such as LOCOS oxidation films 15. The wells 16 serve as bit lines. Except for the points described above, the structure is the same as that shown in FIGS. 2 and 3, with the like parts provided with the same reference numerals, and their explanations are omitted.

While all the above-described structures of the memory cells are of the MFS type in which the ferroelectric layer is directly provided on the semiconductor layer and over which are disposed metallic gate electrodes, the structure may be of the MFIS type in which other type of insulation film such as SiO2 or Si3N4 is interposed between the ferroelectric layer and the semiconductor layer, or an MFMIS type in which a metallic layer of a floating gate is interposed between them. In effect, any type may be employed as long as it constitutes the ferroelectric memory FET in which the ferroelectric layer is provided between the gate electrode of the FET and the semiconductor layer.

Next will be described the verification of the effect of the voltage of ⅓ of Vcc applied to the not-selected cell. The effect is the basis of the fact that data are not destroyed but retained when a voltage is applied in the opposite direction before applying a normal voltage for writing or reading. For this verification, a 300 nm (nanometer) thick PZT was used and a voltage of ⅓ of Vcc was applied to the ferroelectric capacitor, and the change in its switching charge amount (difference between a charge amount produced when a voltage is applied in one direction and polarization direction is switched and a charge amount when the polarization direction is not switched) was examined.

Figure 6A:
FIGS. 6(a) to 6(d) show examples of the waveform applied to examine the disturbance characteristics.
Figure 6B:
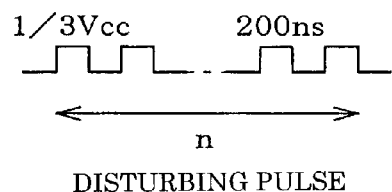
Figure 6C:
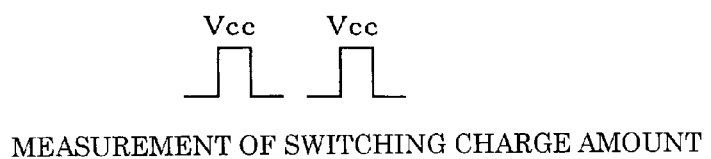
Figure 6D:
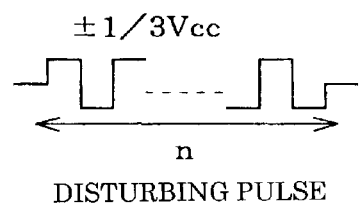

The switching charge amount was measured with the following steps; first a source voltage Vcc was applied in the negative direction shown in FIG. 6(a) to polarize the film in the negative direction, a specified number (n) times of the same directional ⅓·Vcc pulses were applied in the positive (opposite the polarization) direction as shown in FIG. 6(b), and double pulses shown in FIG. 6(c) were applied to measure the switching charge amount. The charge amount measurement was also made for the case in which bi-directional ±⅓ of Vcc pulses shown in FIG. 6(d) were applied alternately in positive and negative directions in place of the same direction pulses shown in FIG. 6(b). Here, the pulse width of the disturbing pulses was always 200 ns (nanoseconds) and the power source voltages were 5 V and 3.3 V (⅓ of each of them was applied). In the case of the bidirectional pulses, two pulses, one positive and the other negative, were applied as 1 cycle.

Figure 7:
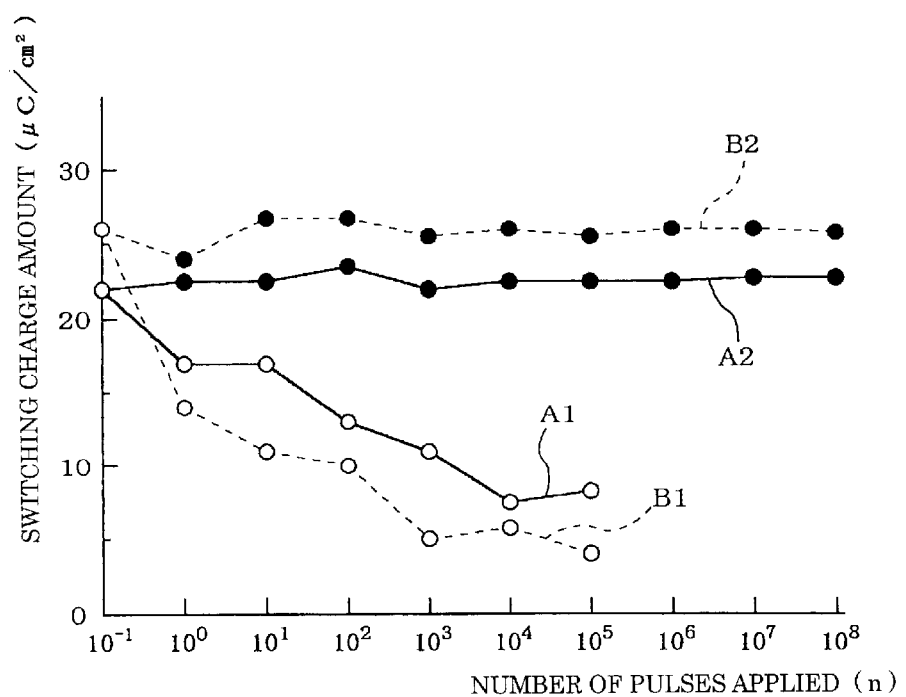
FIG. 7 shows disturbance characteristics versus the number of pulses applied.

FIG. 7 is a graph of absolute values of the switching charge amount measured against the number (n) of pulses applied at a voltage of ⅓ of Vcc (or ±⅓ of Vcc). In FIG. 7, the curve A1 shows the results with the pulses in the same direction at 3.3 V, A2 with the bidirectional pulses at 3.3 V, B1 with the pulses in the same direction at 5 V, and B2 with the bidirectional pulses at 5 V. As is apparent from FIG. 7, the results with the power source voltages of 5 V and 3.3 V are similar to each other; when the same directional pulses are applied, the switching charge amount decreases gradually, to less than ⅓ after pulse application by $10^3$ to $10^4$ times. In other words, this means that there is a risk of data in a cell being erased when the same cell is accessed with repeated disturbing pulses in the same direction.

On the other hand, the results (A2, B2) when pulses are applied in positive and negative directions by turns show that the switching charge amount changes little even after the pulses are applied more than $10^8$ times. This invention has been made on the basis of the above-described fact that the alternate application of pulses in positive and negative directions prevents data from changing even after applying a very large number of pulses.

Figure 8:
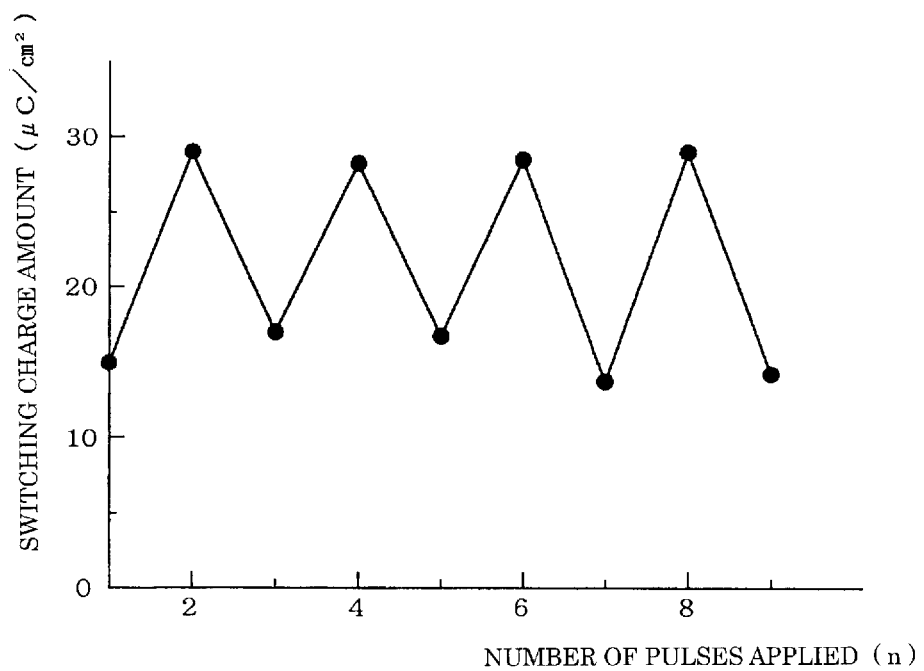
FIG. 8 shows changes in the charge at every application of positive and negative bidirectional pulses.

FIG. 8 shows results of how the switching charge amount changes every time a pulse voltage Vcc of 5 V is applied in positive and negative directions by turns. As seen in FIG. 8, when Vcc is 5 V (applied voltage is 1.67 V), the switching charge amount decrease from 30 to about 15 by the application of a disturbing pulse in the direction opposite the polarization direction. However, it is seen that the amount is restored almost to the original value when a pulse is applied in the same direction as that of the polarization direction. That is to say, although stored charge amount decreases to a certain value when alternate (bidirectional) pulses are applied, the amount does not decrease further. If the remaining amount is sufficient for discriminate the data in question, the data are prevented from being lost by disturbance.

Figure 9:
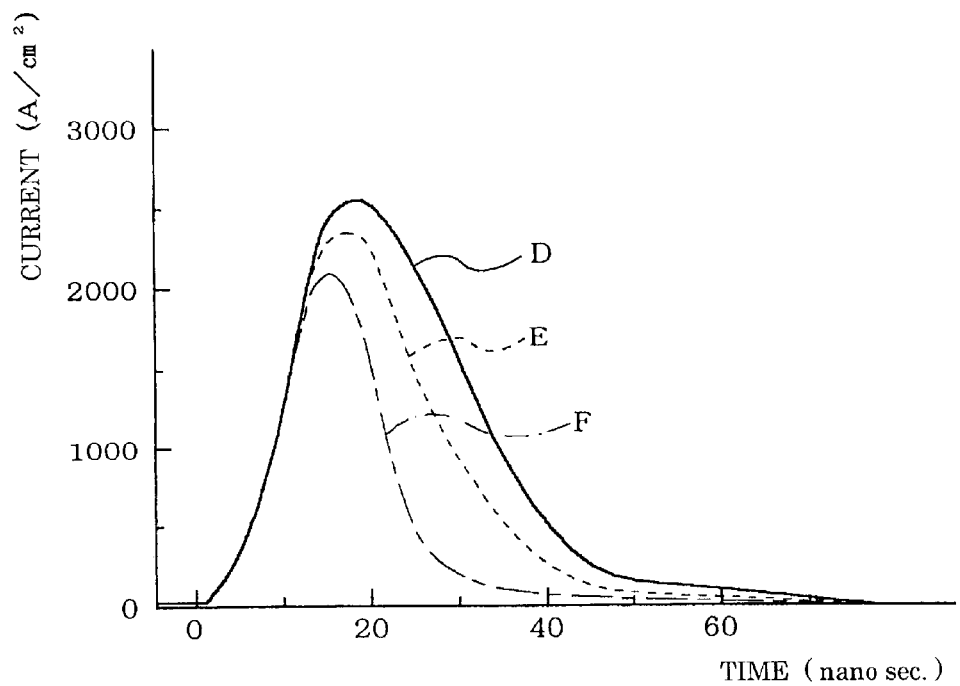
FIG. 9 shows change in the current versus time when voltages are applied to a ferroelectric capacitor.

FIG. 9 shows the change in the switching charge amount represented with the change in the current density (A/cm²) plotted against the time of application of a voltage of ⅓ of Vcc to a capacitor. In FIG. 9, the curve D shows the current density value when data are written and the polarization direction is reversed and thereafter disturbing pulses are applied by an even number (n=2 k) of times, namely after the disturbing pulse is applied in the same direction as the direction of polarization. The curve E shows the current density value after an odd number (n=2 k+1) of times of application, namely after the disturbing pulse is applied in the different direction from that of the polarization. The curve F shows the current density value when data are written by applying a voltage in the same direction as that of the polarization. The switching charge amount described above is the charge amount representing the difference between the current value of the curve D or E, and the current value of the curve F.

Figure 10:
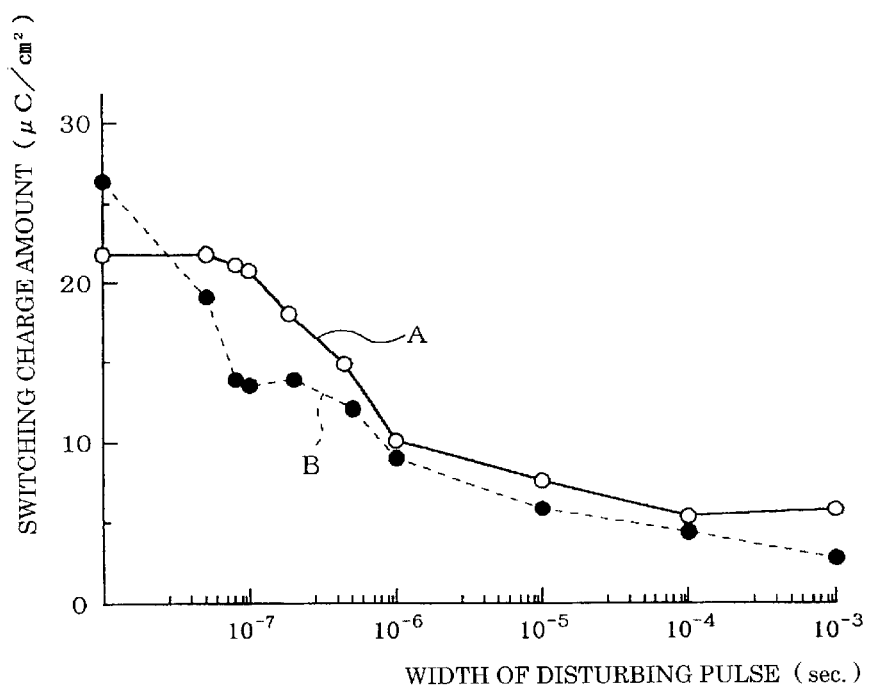
FIG. 10 shows disturbance characteristics versus width of pulses applied.
Figure 11:
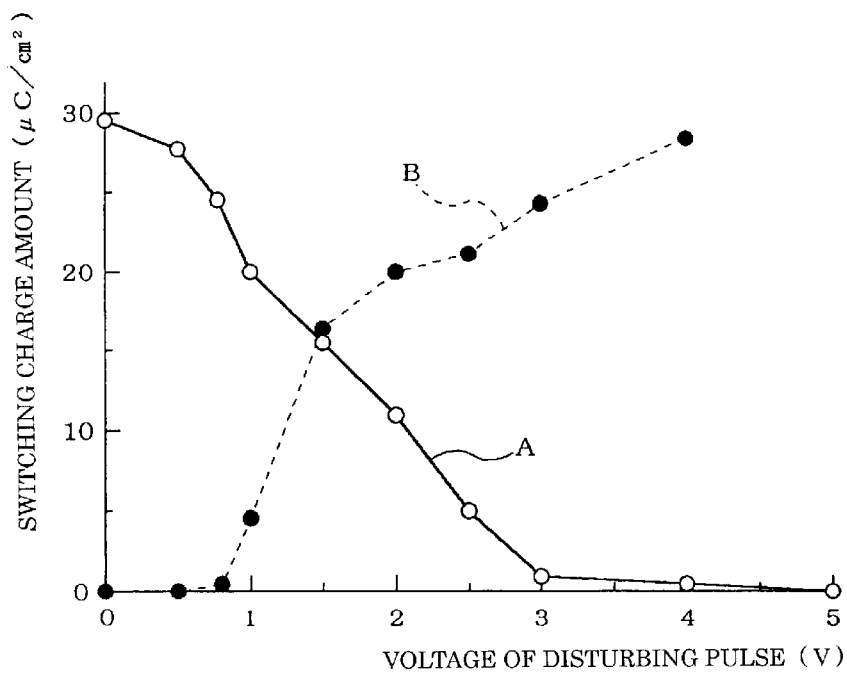
FIG. 11 shows disturbance characteristics versus magnitude (amplitude) of pulses applied.

Next, in order to minimize the decrease in the switching charge amount by one disturbing pulse, the optimum values of pulse width and pulse voltage were examined by examining their dependence on the pulse width and on the power source voltage Vcc. The results are shown in FIGS. 10 and 11. FIG. 10 shows the results of measurements of decrease in the amount of stored charge by the application of a single disturbing pulse (in the direction opposite the polarization direction) of various pulse widths at the power source voltage of 3.3 V (curve A) and 5 V (curve B). As seen in the graph, the decrease increases with the increase in the pulse width. It is seen that disturbance (decrease in the charge amount) is very small when Vcc=3.3 V, and the pulse width is $10^{-7}$ second or less. Since the pulse width with the actual element is expected to be $10^{-7}$ second or less, it can be said that there will be no possibility of strong disturbance with a single pulse.

FIG. 11 shows the results of measurements of the switching charge amount after applying a disturbing voltage in the directions opposite the polarization direction to a capacitor polarized in positive and negative directions, at various disturbing voltages. The graph (A) shows the results with the pulse direction opposite the polarization direction of writing, and the graph (B) shows the results with the pulse direction same as the polarization direction of writing. The pulse width was 500 ns. The difference between the switching charge amounts in two capacitors is the charge amount for detecting data. From the figure it is seen that the order of magnitudes of the switching charge amounts of two capacitors is reversed at the disturbing voltage of about 1.5 V and that the data cannot be detected any more. In order to retain a charge amount sufficient for detecting data even when a disturbing pulse of ⅓ of Vcc is applied, it is most suitable that the Vcc is about twice the voltage at which the two curves A and B intersect each other. However, since this characteristic varies with the thickness and saturation characteristic of the ferroelectric, and the like, it seems better to choose the layer thickness and the material suitable for the Vcc rather than to choose Vcc suitable for the layer. For the layer examined this time, the most suitable conditions seem to be the power source voltage of Vcc of 3.3 V, and the writing pulse width of 100 ns or smaller.

As described above, when application of disturbing voltage in the same direction is repeated more than a certain number of times, there is a risk of data written to cells other than the one selected are erased. And the risk depends greatly on the width and magnitude of the pulses. However, according to this invention, since voltages in positive and negative directions are regularly applied, the decrease in the charge amount corresponding to the data occurs only with the first application of the disturbing voltage, and thereafter no additional decrease occurs. As a result, if the power source voltage Vcc, writing and reading speed, ferroelectric material, ferroelectric layer thickness, etc. are optimized to the extent that the decrease in the charge amount by the first application of disturbing voltage causes no problem in reading the data, the data are always retained without being erased even if the disturbing pulses are applied $10^8$ times. As a result, a random access memory may be constituted with matrix arrangement of even ferroelectric memory FETs.

In the above-described example, the opposite directional voltage is applied before applying a writing or reading voltage for both writing and reading. However, depending on the type of the semiconductor memory, there may be a case in which the frequency ratio of writing to reading is extremely unbalanced. In that case, it is possible to use a selection element to the side frequently accessed (writing or reading) to access the selected cell so that the element is not used on the side used less frequently. Thus, the method of this invention is used to gain access without reducing the writing and reading speed while reducing the chip area by reducing the number of selection elements.

Next will be described a semiconductor memory using a ferroelectric layer and a method of gaining access thereto as another embodiment of the invention in reference to the appended drawings.

The semiconductor memory using ferroelectric layers as another embodiment of the invention is partially shown in FIG. 12 as an equivalent circuit diagram. It comprises ferroelectric memory FETs each having a ferroelectric layer between a gate electrode and a semiconductor layer. It comprises for example; a plural number (four in FIG. 12) of memory cells Q1 through Q4 arranged in a matrix pattern, buffer cells 20 capable of transferring the data from the memory cells Q1 through Q4, and buffer circuits 30 that transfer the data from the memory cells Q1 through Q4 to the buffer cells 20, and write the transferred data again to the memory cells Q1 through Q4. That is to say, the inventor has diligently and repeatedly examined the effect of the disturbing voltage of ⅓ of Vcc applied to the not-selected cell on the data in the not-selected cell by the change in the charge amount in the ferroelectric capacitor.

As a result, it has proved that, as will be described in detail later, the data stored are disturbed to a certain rate depending on the magnitude and duration of the voltage applied by writing or reading even if a low voltage is applied, and the data can be prevented from being destroyed by rewriting (refreshing) the data regularly. This invention is based on the above-described findings and characterized in that the buffer cells 20 and buffer circuit 30 capable controlling transferring the buffer cells 20 and rewriting are provided so that the data are regularly refreshed.

The structure of the buffer cell 20 shown in FIG. 12 as an example may be the same as that of the ferroelectric memory FET of the memory cell in which a ferroelectric layer is interposed between the gate and the semiconductor layer of an FET. However, other structures may be used as long as a certain amount of data can be stored. The buffer cells 20 are preferably provided at least in one row parallel to the vertical or lateral row of the memory cells arranged in a matrix pattern so that at least every one row in the matrix is refreshed at once.

The buffer circuit 30 constitutes a control circuit to transfer data from the memory cell to the buffer cell 20 and to write again the transferred data to the memory cell. In the example shown in FIG. 12, a first selection element 31 made of an FET is located to make connection between the data line DL of the memory cell and the gate of the buffer cell 20. The gates of the first selection elements 31 arranged in a lateral row (and respectively connected to the buffer cells arranged in a row) are interconnected to lead out RL5. The drains (sources) of second selection elements 32 made of FETs are connected to the gates of the buffer cells 20. The sources (drains) of the second selection elements arranged in a lateral row are interconnected to lead out RL3, and likewise the gates are interconnected to lead out RL4. The sources of the buffer cells 20 are interconnected to lead out RL1. The substrates of the buffer cells 20 are interconnected and connected to the RL2. The drains of the buffer cells 20 are connected through transformers 33 to the bit lines BL of the memory cells. Thus, the circuit is constituted.

These structures made by arranging the memory cells may be made similar to that for example shown in FIGS. 2 and 3. Or, like the above-described case, the structure may be made as shown in FIGS. 4 and 5.

Like the case described above, the structure of these memory cells may be the MFS type in which a ferroelectric layer is disposed directly on a semiconductor layer over which a metallic layer to be the gate electrode is disposed, or an MFIS type in which another insulation film such as SiO2 or Si3N4 is interposed between the ferroelectric layer and the semiconductor layer, or an MFMIS type in which a metallic layer of a floating gate is interposed between them. In effect, any type maybe employed as long as the ferroelectric layer is provided between the semiconductor layer and the gate electrode of the FET to constitute a ferroelectric memory FET.

Concerning the effect of the ⅓ of Vcc applied to the not-selected cell which is the basis of providing the buffer cell and the buffer circuit to make it possible to store data without being destroyed by refreshing the data, the effect is similar to that in the above-described cases (FIGS. 6, 7, 10 and 11) and so the description is omitted.

As described above, when application of disturbing voltage in the same direction is repeated more than a certain number of times, there is a risk of data written to cells other than the one selected are erased. And the risk depends greatly on the width and magnitude of the pulses. It has been found that the decrease in the charge amount caused by the disturbing pulses can be reduced by optimizing the power source voltage Vcc, the writing (reading) speed, the ferroelectric material, and the ferroelectric layer thickness. On the basis of such finding described above, a random access memory can be constituted even with ferroelectric memory FETs arranged in a matrix pattern to retain data without being erased as the data are refreshed at intervals of a certain number of times of (about 1000 times for example) rewriting.

Next, in reference to the circuit diagram of the semiconductor memory shown in FIG. 12 as an embodiment of the invention, a method of accessing and refreshing the data in the memory will be described. First, the buffer cell 20 in the buffer circuit 30 is initialized by writing "0" to the buffer cell 20. In a sequence, Vcc is applied to the RL4 to turn on the second selection element 32, and the RL3 is grounded and Vcc is applied to the RL2. With this operation, "0" is written to all the ferroelectric memory FETs (buffer cells 20) in the buffer circuits. Next, the data in the memory cell are transferred to the buffer cell 20. In a sequence, the first selection element 31 is turned on by applying Vcc to the RL5 and grounding the RL4, and a line is selected that is connected to the gate of the buffer cell 20. A voltage V1 is applied to the word line WL1 in the row of memory cells from which the transfer copy is made, and the bit line BL is grounded. The voltage V1 is of a value required to turn on the FET of the memory cell which is connected to the WL1 and to which "1" is written, and is determined by the difference in the threshold voltages of the FET and the impurity concentration in the Si substrate. The threshold voltage of the FET can be adjusted by adjusting the amount of impurities added. When Vcc is applied to the SL1, only the DL of the cell of which the memory FET is turned on is set to the potential Vcc. Then, the Vcc is applied to the gate of the buffer cell 20 connected to the memory cell, and thus the data "1" is written to the buffer cell 20.

Figures 12A, 12B:
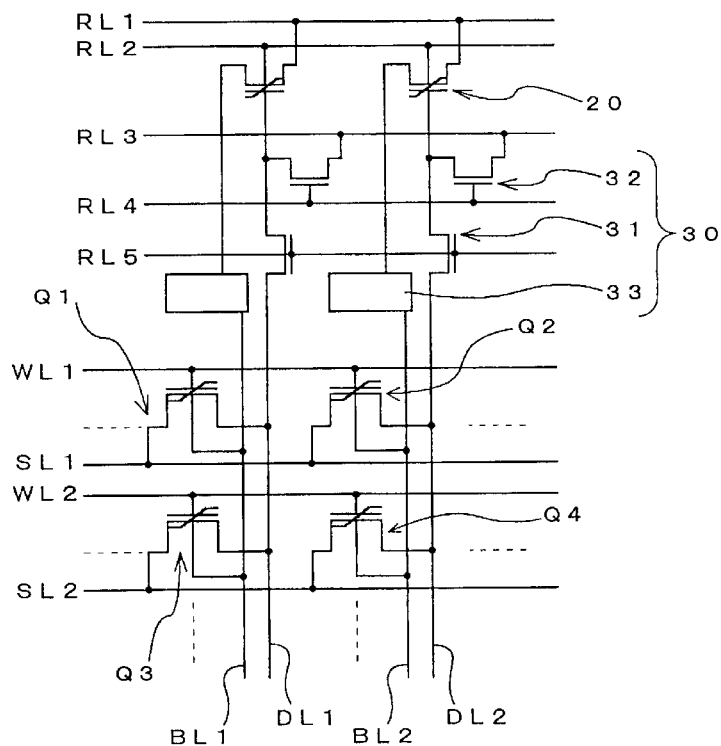
FIG. 12 shows an equivalent circuit diagram of a semiconductor memory as another embodiment of the invention.

Next, the data stored in the buffer cell 20 are rewritten to the memory cell. First, the memory cell is initialized. A voltage Vcc is applied to the WL1. BL1 and BL2 are grounded to write "1" to the memory cell connected to the WL1. Next, the data in the buffer cell are transferred to the memory cell. The sequence is; a voltage Vcc is applied to the RL4, and the RL5 is grounded to turn off the first selection element 31 and to turn on the second selection element 33. With a voltage Vrw lower than Vcc applied to the RL1, a voltage of 0 or Vrw is applied to the transformer 33. In the transformer 33, the voltage 0 is transformed to Vcc, and Vrw is transformed to ⅓ of Vcc. With the WL1 and WL2 set like in the case of writing the data "0" in FIG. 10, the original data is written to the memory cell. The sequence of transferring and rewriting the data is shown in FIG. 12(b).

The setting of the operation intervals in the rewriting sequence may be considered in two ways. A period of time taken for the data to disappear (to become indistinguishable) when a disturbing voltage of ⅓ of Vcc in the opposite direction to that of writing voltage is applied to the cell having the data written is assumed to be te, and the disturbing pulse width of one writing is assumed to be tw, there is a risk of the data disappearing after n times of writing actions, where n=te/tw. Therefore, to prevent the data from disappearing, the number of writing actions is counted with a counter, and a rewriting action is made before the number of writing actions reaches n. In this case, the data is also lost by a small amount every time of reading action. Therefore, it is preferable to count also the number of reading actions and convert it to the number of writing actions (since the voltage applied for reading is smaller than that for writing, the degree of disturbance by reading is also smaller in proportion to the reading voltage).

The other method of determining the data refreshing timing is considered that the data is not lost if the rewriting sequence is carried out at every equal period shorter than te by the use of a timer. That is to say, if the frequencies of writing and reading are almost constant relative to the time of use of the semiconductor memory, the time point at which the data disappears can be estimated so that a refreshing is carried out before that time point.

Which of these methods should be used depends on the use environment of the semiconductor memory or on the ratio of number of writing actions to reading actions. In the case one of writing and reading is made very frequently, it is possible that one selection element is provided for the higher frequency so that the disturbing voltage is not applied at all. In that way, the data can be retained almost without carrying out refreshments.

Since this buffer circuit for rewriting need be provided one only for either lateral or vertical row, it almost does not increase the chip area. Therefore, it is possible to retain data for a long period of time with a small sized cell almost without need for increasing the chip area. Moreover, since the data need not be refreshed regularly but be refreshed according to the frequency of use, there is almost no decrease in processing time by the refreshing. Furthermore, since data in the ferroelectric layer are retained unchanged when the circuit is not in use with the power source off, there is no need for refreshing the data when the circuit is not in use.

With this invention, when data are written to or read from the semiconductor memory comprising ferroelectric memory FETS arranged as a matrix, data do not disappear even with the disturbing voltage applied to cells not selected. Therefore, instead of using two selection elements conventionally for writing and reading to completely prevent disturbance, it is possible to eliminate or reduce the number of selection elements, and to provide a non-volatile semiconductor memory by the use of ferroelectric memory FETs of a small size with one FET per one cell and with reduced cell area.

This invention allows to write or read data without the data being destroyed even without a selection element by simply refreshing the data at certain time intervals commensurate with the use frequency. Therefore, it is possible to put to practical use a non-volatile semiconductor memory with ferroelectric memory FETs arranged as a matrix with one FET per one cell with small-sized chips capable of retaining data The refreshing time intervals can be estimated from the characteristics (thickness, dielectric characteristics, and the like) of the ferroelectric layer used and use conditions (power source voltage, pulse width, and soon), and can be reliably measured with a counter or a timer, so that the data can be maintained without being destroyed.

Though the invention has been described by way of preferred embodiments, the terms herein are used not for limitation but for explanation only and may be changed or modified within the scope of the appended claims without departing from the scope and spirit of the invention.

What is claimed is:

1. A semiconductor memory provided with ferroelectric layers, comprising:
   memory cells each comprising a ferroelectric memory FET having a ferroelectric layer between a gate electrode and a semiconductor layer;
   buffer cells capable of storing data from the memory cells to prevent the data from being lost when a disturbing voltage is applied to the memory cells; and
   buffer circuits for transferring the data in the memory cells to the buffer cells and further writing the transferred data again to the memory cells.

2. The semiconductor memory of claim 1, wherein a plural number of the memory cells are arranged as a matrix, the buffer cells are capable of storing data from at least one line of the memory cells, and each buffer circuit is capable of transferring data in at least one line of the memory cells as a whole to the buffer cells and writing again to the memory cells.

3. The semiconductor memory of claim 1, wherein the buffer cells comprise ferroelectric memory FETs each having a ferroelectric layer between a gate electrode and a semiconductor layer.

4. The semiconductor memory of claim 3, wherein each buffer circuit comprises; a first selection element for making connection between the gate electrode of each buffer cell and a data line of the memory cell to control the transfer of data from the memory cell, a second selection element connected to the gate side of the buffer cell to control the reading of data from the buffer cell, and a transformer connected to a bit line connecting substrates of the memory cells for converting the voltage of the data read from the buffer cell.

5. The semiconductor memory of claim 2, wherein the buffer cells comprise ferroelectric memory FETs each having a ferroelectric layer between a gate electrode and a semiconductor layer.

6. The semiconductor memory of claim 5 wherein each buffer circuit comprises; a first selection element for making connection between the gate electrode of each buffer cell and a data line of the memory cell to control the transfer of data from the memory cell, a second selection element connected to the gate side of the buffer cell to control the reading of data from the buffer cell, and a transformer connected to a bit line connecting substrates of the memory cells for converting the voltage of the data read from the buffer cell.

7. The semiconductor memory of claim 1, wherein buffer cells are positioned in one row parallel to a row of memory cells.

8. The semiconductor memory of claim 1, wherein each memory cell further comprises an insulation film between the ferroelectric layer and the semiconductor layer.

9. The semiconductor memory of claim 8, wherein the insulation layer is selected from the group consisting of $SiO_2$ and $Si_3N_4$.

10. The semiconductor memory of claim 8, wherein each memory cell further comprises a metallic layer between the ferroelectric layer and the isolation film.

11. The semiconductor memory of claim 4, wherein the first selection element is an FET.

12. The semiconductor memory of claim 11, wherein gates of the first selection elements are arranged in a row and connect to a first lead out.

13. The semiconductor memory of claim 4, wherein the second selection element is an FET.

14. The semiconductor memory of claim 13, wherein drains of the second selection elements connect to gates of the buffer cells.

15. The semiconductor memory of claim 13, wherein sources of the second selected elements are arranged in a row and connect to a second lead out.

16. The semiconductor memory of claim 13, wherein gates of the second selection elements connect to a third lead out.

17. The semiconductor memory of claim 3, wherein sources of the buffer cells connect to a fourth lead out.

18. The semiconductor memory of claim 1, wherein substrates of the memory cells connect to a fifth lead out.

19. A semiconductor memory provided with ferroelectric layers, comprising:
   a plural number of memory cells arranged in a matrix each memory cell comprising a ferroelectric memory FET having a ferroelectric layer between a gate electrode and a semiconductor layer;
   buffer cells capable of storing data from at least one line of the memory cells to prevent the data from being lost when a disturbing voltage is applied to the memory cells, wherein the buffer cells comprise ferroelectric memory FETs each having a ferroelectric layer between a gate electrode and a semiconductor layer; and
   buffer circuits for transferring the data in at least one line of the memory cells as a whole to the buffer cells and further writing the transferred data again to the memory cells,
      wherein each buffer circuit comprises; a first selection element for making connection between the gate electrode of each buffer cell and a data line of the memory cell to control the transfer of data from the memory cell, a second selection element connected to the gate side of the buffer cell to control the reading of data from the buffer cell, and a transformer connected to a bit line connecting substrates of the memory cells for converting the voltage of the data read from the buffer cell.

20. A semiconductor memory provided with ferroelectric layers, comprising:

memory cells each comprising a ferroelectric memory FET having a ferroelectric layer between a gate electrode and a semiconductor layer;

buffer cells capable of storing data from the memory cells to prevent the data from being lost when a disturbing voltage is applied to the memory cells, wherein the buffer cells comprise ferroelectric memory FETs each having a ferroelectric layer between a gate electrode and a semiconductor layer; and buffer circuits for transferring the data in the memory cells to the buffer cells and further writing the transferred data again to the memory cells, wherein each buffer circuit comprises; a first selection element for making connection between the gate electrode of each buffer cell and a data line of the memory cell to control the transfer of data from the memory cell, a second selection element connected to the gate side of the buffer cell to control the reading of data from the buffer cell, and a transformer connected to a bit line connecting substrates of the memory cells for converting the voltage of the data read from the buffer cell.

* * * * *